Figure 1:
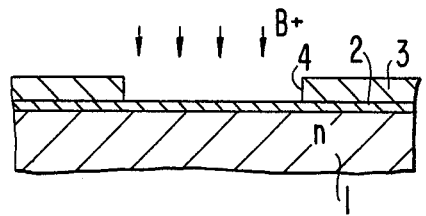
Figure 4:
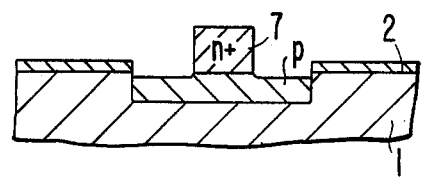

United States Patent [19]

Scovell et al.

[11] Patent Number: 4,916,517
[45] Date of Patent: Apr. 10, 1990

[54] SEMICONDUCTOR DEVICES

[75] Inventors: Peter D. Scovell, Chelmsford; Peter F. Blomley, Bishops Stortford; Roger L. Baker, Chelmsford; Gary J. Tomkins, Maidstone, all of England

[73] Assignee: STC, PLC, London, England

[21] Appl. No.: 282,956

[22] Filed: Dec. 5, 1988

Related U.S. Application Data

[60] Continuation of Ser. No. 71,474, Jul. 9, 1987, abandoned, which is a division of Ser. No. 831,257, Feb. 20, 1986, abandoned.

[30] Foreign Application Priority Data

Mar. 23, 1985 [GB] United Kingdom ............... 8507602

[51] Int. Cl.$^4$ .................. H01L 21/74; H01L 29/12
[52] U.S. Cl. ........................... 357/68; 357/56; 357/59
[58] Field of Search ............ 357/71, 67, 49, 54, 357/55, 56, 59

[56] References Cited

U.S. PATENT DOCUMENTS

| 4,188,707 | 2/1980 | Asano . | |
|---|---|---|---|
| 4,400,865 | 8/1983 | Goth et al. | 357/59 |
| 4,521,952 | 6/1985 | Riseman | 357/67 |
| 4,529,996 | 7/1985 | Pande | 357/56 |
| 4,691,219 | 9/1987 | Goth | 357/54 |

FOREIGN PATENT DOCUMENTS

| 0034341 | 8/1981 | European Pat. Off. . |
| 0036620 | 9/1981 | European Pat. Off. . |
| 0122004 | 10/1984 | European Pat. Off. . |
| 2358750 | 2/1978 | France . |

OTHER PUBLICATIONS

"A True Polysilicon Emitter Transistor", M. B. Rowlandson et al, IEEE Electron Device Letters, vol. 6, 1985, Jun., No. 6, pp. 288–290.

IEEE International Solid-State Circuits Conference, vol. 24, Feb. 1981, pp. 216–217, IEEE, New York, U.S., T. Sakai et al, "A 3nS 1Kb RAM Using Super Self-Aligned Process Technology".

Patent Abstracts of Japan, vol. 5, No. 159 (E-77) (831), 14th Oct. 1981, JP-A-56 90 561 (Fujitsu H. K.).

*Primary Examiner*—Rolf Hille
*Assistant Examiner*—S. Clark
*Attorney, Agent, or Firm*—Kerkam, Stowell, Kondracki & Clarke

[57] ABSTRACT

A fully self-aligned polycrystalline silicon emitter bipolar transistor. Self-alignment of the p$^+$ base contact (12) is achieved by using oxidised sidewalls (8) (sidewall spacers) of the emitter mesa (7) as part of the p$^+$ base contact implantation mask. Collector contact (13) alignment can be achieved using oxidised sidewalls (17) of polycrystalline silicon alignment mesas (14) defined in the same polysilicon as the emitter mesa (7) but deposited on oxide (2) rather than the implanted base region (5).

3 Claims, 1 Drawing Sheet

SEMICONDUCTOR DEVICES

This is a continuation of application Ser. No. 071,474 filed July 9, 1987, now abandoned which is a divisional of Ser. No. 831,257 filed Feb. 20, 1986, now abandoned.

This invention relates to semiconductor devices and in particular bipolar transistors with polycrystalline silicon emitters, and methods of manufacturing them.

The use of a polycrystalline silicon emitter offers improved performance for bipolar transistors. Several methods of self-aligning this type of device have been published, for example Tang D., IEEE JSSC SC17 1983 p. 226 and Sakai T., IEEE EIDM Techn. Drg. 1983 p. 16. These methods rely on the use of polysilicon (polycrystalline silicon) base contacts and therefore two layers of polysilicon are required.

According to one aspect of the present invention, there is provided a method of manufacturing a bipolar transistor including the steps of defining a polycrystalline silicon emitter mesa on an unoxidised surface of a base region disposed in a semiconductor substrate, oxidising side walls of the mesa and the exposed unoxidised surface of the base region, and implanting a base contact region into the substrate in contact with the base region using at least one oxidised side wall of the mesa as part of the implantation mask whereby the base contact region is self-aligned with the emitter.

According to another aspect of the present invention there is provided a bipolar transistor including a polycrystalline silicon emitter mesa in contact with a base region and including a base contact, the emitter having an oxidised sidewall which during manufacture of the transistor serves for self-alignment of the base contact.

Figure 7:
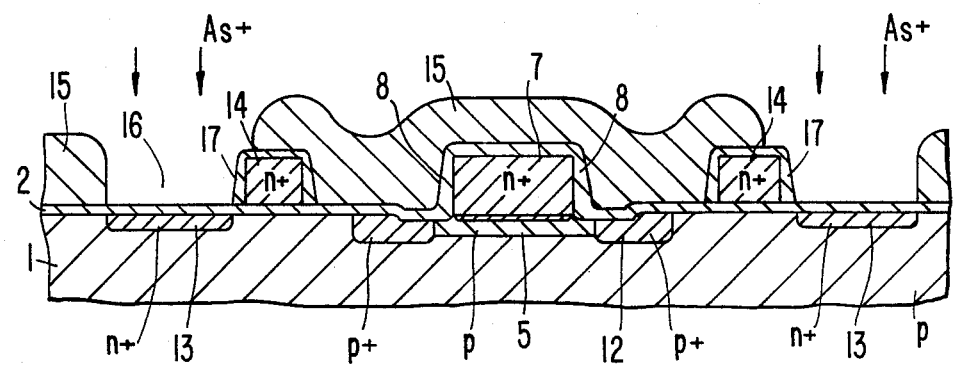

Embodiments of the present invention will now be described with reference to the accompanying drawings, in which:

FIGS. 1 to 6 illustrate, schematically and in cross-section, successive processing stages in the manufacture of self-aligned base contacts according to one embodiment of the present invention, and FIG. 7 illustrates a cross-section through a fully self-aligned polysilicon emitter bipolar transistor.

Figure 2:
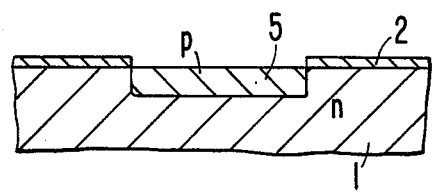
Figure 5:
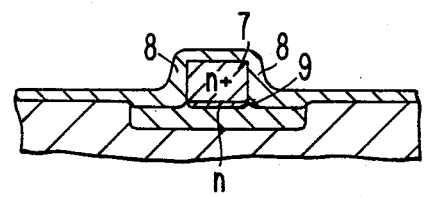
Figure 3:
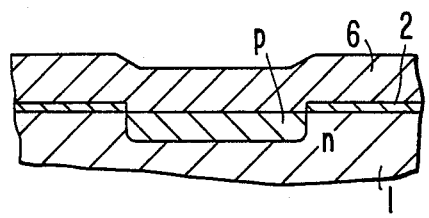
Figure 6:
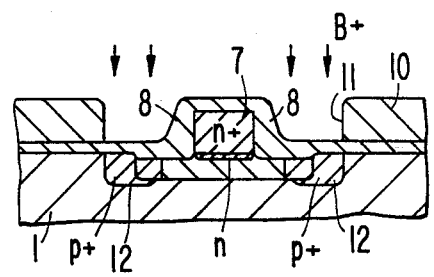

Referring firstly to FIGS. 1 to 6 the successive processing stages required to manufacture self-aligned base contacts will be described. A substrate 1 of n-type single crystal silicon is oxidised to provide a surface layer of silicon dioxide 2. A layer of photoresist 3 is applied and using a suitable mask (not shown) a window 4 is opened in the photoresist 3, which window 4 defines the base area (FIG. 1). Using ion implantation boron, for example, is implanted to produce a base 5. Following this implantation the oxide exposed through window 4 is etched using the base mask (photoresist 3) to define the area within which the emitter will be formed. The photoresist 3 is removed (FIG. 2). If a surface treatment is required to produce an interfacial oxide it can be used now. A layer of polysilicon 6 is then deposited (FIG. 3) and doped n+, for example with arsenic or phosphorus. Following definition of the emitter area the polysilicon 6 is dry etched to produce the structure of FIG. 4 with a substantially central n+ polysilicon mesa or emitter 7. The dry etch is controlled to give good anisotropy and high selectivity over the single crystal silicon substrate 1. We have demonstrated a selectivity of 10:1. For typical layer thickness and overetches this would lead to less than 500 A (0.05 m) of the base being consumed during the polysilicon etch process. The structure is then provided with oxide sidewall spacers 8 (FIG. 5). The spacers may be produced by, for example the oxidation method described in British Patent No. 2172743B-or by using reactive ion etching (RIE) of a conformed deposited oxide. The method described in our co-pending Application involves the use of a silicon nitride capping layer on a polysilicon mesa (emitter) and oxidising the sidewalls of the mesa at a low temperature which is preferably below 900° C. in order to take full advantage of the differential oxidation ratio of polysilicon and single crystal silicon. As a result of this processing a n type region 9 is formed. The structure is then provided with a photoresist layer 10 (FIG. 6) which is patterned using a suitable mask (not shown) to provide a window 11 therein, that is to define a p+ contact mask. A base contact implant of, for example, boron is performed to produce base contacts 12 which are self-aligned with the polysilicon emitter region 7 by virtue of using the polysilicon and sidewall spacers 8 as a part of the p+ contact mask. To complete a bipolar transistor from the structure of FIG. 6 a collector contact (not shown) to the substrate 1 is required together with suitable metallization, for example, to provide external electrical contacts to the base and collector contacts and to the polysilicon emitter.

A section through a complete bipolar transistor is shown in FIG. 7. This transistor has collector contacts 13 which are aligned to the emitter edges by use of polysilicon stripes (alignment mesas) 14 defined in the same masking at etching sequence as the emitter mesa 7. The sidewalls 17 of the stripes 14 are also oxidised as those of the emitter 7. A photoresist layer 15 is applied and patterned using a mask not shown to provide windows 16 for implantation of arsenic, for example, for the collector contacts 13. The mask need only be a "sloppy" mask since the outermost oxidised edges of the stripes 14 define the edge of the collector contacts and photoresist is only required to protect areas into which collector contact material is not to be implanted. The edge of the polysilicon stripe defines the distance between the emitter edge and the collector contact. The device is thus fully self-aligned.

The self-alignment of the base contacts is thus achieved by a method which uses a single layer of polysilicon and sidewalls and is simplified in comparison, with the method using two layers of polysilicon as required in the known methods referred to above.

I claim:

1. A bipolar transistor including a single crystal silicon substrate of one conductivity type, a first region of the substrate comprising a collector of the transistor; a second region of the substrate extending into the first region from a surface of the substrate, which second region is doped to be of the opposite conductivity type; a polycrystalline silicon mesa element of the one conductivity type disposed on said surface substantially centrally of the second region; the mesa element being of less width than the second region when measured in a first direction, the mesa element having oxide sidewall spacers thereon; a pair of spaced apart third regions of the substrate which are doped to be of the opposite conductivity type, the third regions being disposed on opposite sides of the mesa extending into the first regions from the said surface, which third regions are more highly doped than the second region, contact the second region and are spaced apart in the first direction by a distance of the order of the width of the mesa with the oxide sidewalls thereon; a fourth region which is of the one conductivity type and more highly doped than the first region extending into the first region from the said surface at a position spaced apart from one said third region in the first direction; and a polycrystalline silicon alignment element laterally spaced from the polycrystalline silicon mesa element in the first direction, the fourth region being laterally spaced from the mesa element in the first direction by a least the width of the one said third region in the first direction taken together; the second region comprising a base of the transistor, the third regions comprising base contacts of the transistor, the mesa comprising a polycrystalline silico emitter of the transistor, and the fourth region comprising a collector contact of the transistor.

2. A bipolar transistor as claimed in claim 1 wherein the polycrystalline silicon alignment element is disposed on an oxide layer on the said substrate surface, the polycrystalline silicon alignment element having oxidized sidewalls and the fourth region being laterally spaced from the one said third region by at least the width in the first direction of the alignment element with the oxidized sidewalls thereon, the alignment elements serving no useful purpose in the transistor other than for definition of the lateral spacing.

3. A bipolar transistor including a single crystal silicon substrate of one conductivity type, a first region of the substrate comprising a collector of the transistor; a second region of the substrate extending into the first region from a surface of the substrate, which second region is doped to be of the opposite conductivity type; a polycrystalline silicon mesa element of the one conductivity type disposed on said surface substantially centrally of the second region; the mesa element being of less width than the second region when measured in a first direction, the mesa element having oxide sidewall spacers thereon; a pair of spaced apart third regions of the substrate which are doped to be of the opposite conductivity type, the third regions being disposed on opposite sides of the mesa extending into the first region from the said surface, which third regions are more highly doped than the second region, contact the second region and are spaced apart in the first direction by a distance of the order of the width of the mesa with the oxide sidewalls thereon; a fourth region which is of the one conductivity type and more highly doped than the first region extending into the first region from the said surface at a position spaced apart from one said third region in the first direction; and a polycrystalline silicon alignment element disposed on an oxide layer on said substrate surface and laterally spaced from the polycrystalline silicon mesa element, the polycrystalline silicon alignment element having oxidized sidewalls and the fourth region being laterally spaced from the one said third region at leat by the width in the first direction of the alignment element with the oxidized sidewalls thereon, the alignment element serving no useful purpose in the transistor other than for definition of the lateral spacing; the second region comprising a base of the transistor, the third regions comprising base contacts of the transistor, the mesa comprising a polycrystalline silicon emitter of the transistor, and the fourth region comprising a collector contact of the transistor.

* * * * *

UNITED STATES PATENT AND TRADEMARK OFFICE
CERTIFICATE OF CORRECTION

PATENT NO. : 4,916,517

DATED : April 10, 1990

INVENTOR(S) : Peter D. SCOVELL, ET AL

It is certified that error appears in the above-identified patent and that said Letters Patent is hereby corrected as shown below:

Column 3, line 13

Claim 1, line 33: "delete "silico" and substitute -- silicon --

Column 4, line 22

Claim 3, line 30: delete "leat" and substitute -- least --

Signed and Sealed this

Sixth Day of August, 1991

Attest:

HARRY F. MANBECK, JR.

Attesting Officer

Commissioner of Patents and Trademarks